US012813320B2

(12) United States Patent
Seo et al.

(10) Patent No.: US 12,813,320 B2
(45) Date of Patent: Nov. 24, 2026

(54) METHOD OF MANUFACTURING A SEMICONDUCTOR PACKAGE INCLUDING A DAM

(71) Applicant: SK hynix Inc., Icheon-si (KR)

(72) Inventors: Kyung Beom Seo, Icheon-si (KR); Jong Kyu Moon, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 651 days.

(21) Appl. No.: 18/339,840

(22) Filed: Jun. 22, 2023

(65) Prior Publication Data

US 2024/0304467 A1 Sep. 12, 2024

(30) Foreign Application Priority Data

Mar. 10, 2023 (KR) ........................ 10-2023-0032124

(51) Int. Cl.
*H10W 90/00* (2026.01)
*H10W 74/01* (2026.01)

(52) U.S. Cl.
CPC ....... *H10W 74/017* (2026.01); *H10W 74/014* (2026.01); *H10W 90/00* (2026.01); *H10W 90/722* (2026.01); *H10W 90/724* (2026.01)

(58) Field of Classification Search
CPC . H10W 74/017; H10W 90/00; H10W 74/014; H10W 90/724; H10W 90/722
See application file for complete search history.

(56) References Cited

U.S. PATENT DOCUMENTS 5,927,505 A 7/1999 Chia et al.
10,367,123 B2 * 7/2019 Im ........................ H10H 20/852
2008/0054441 A1 * 3/2008 Lin ..................... H10W 74/014 257/793
2014/0091344 A1 * 4/2014 Wang ................... H10H 20/853 257/98
2021/0384134 A1 * 12/2021 Liu ......................... H10P 72/74

FOREIGN PATENT DOCUMENTS

KR 1020220049423 A 4/2022

* cited by examiner

*Primary Examiner* — Trang Q Tran
(74) *Attorney, Agent, or Firm* — WILLIAM PARK AND ASSOCIATES LTD.

(57) ABSTRACT

A method of manufacturing a semiconductor package includes disposing semiconductor chips over a substrate. The method also includes forming a dam surrounding the semiconductor chips, the dam providing a reservoir in a perimeter region of the substrate. The method further includes forming a molding layer encapsulating the semiconductor chips on the substrate. The extrusion flowing out from the molding layer is contained in the reservoir while being blocked by the dam.

13 Claims, 12 Drawing Sheets

METHOD OF MANUFACTURING A SEMICONDUCTOR PACKAGE INCLUDING A DAM

CROSS-REFERENCE TO RELATED APPLICATIONS

The present application claims priority under 35 U.S.C. 119 (a) to Korean Application No. 10-2023-0032124, filed on Mar. 10, 2023, in the Korean Intellectual Property Office, which is incorporated herein by reference in its entirety.

BACKGROUND

1. Technical Field

The present disclosure generally relates to a packaging technology and, more particularly, to a method of manufacturing a semiconductor package including a dam.

2. Related Art

Various semiconductor packages are required for electronic products. Accordingly, efforts are being made to improve semiconductor packaging technology. A semiconductor package may be implemented by forming a molding layer covering a semiconductor chip on a substrate. During a process of forming the molding layer, a defect such as mold flash may occur due to leakage of a molding material to the outside of a substrate. The mold flash may result in quality deterioration of the semiconductor package. The mold flash may cause contamination of the semiconductor package or contamination of molding equipment.

SUMMARY

A method of manufacturing a semiconductor package in accordance with an embodiment includes disposing semiconductor chips over a substrate. The method also includes forming a dam surrounding the semiconductor chips, the dam providing a reservoir in a perimeter region of the substrate. The method further includes forming a molding layer encapsulating the semiconductor chips on the substrate. The extrusion flowing out from the molding layer is contained in the reservoir while being blocked by the dam.

DETAILED DESCRIPTION

Figure 1:
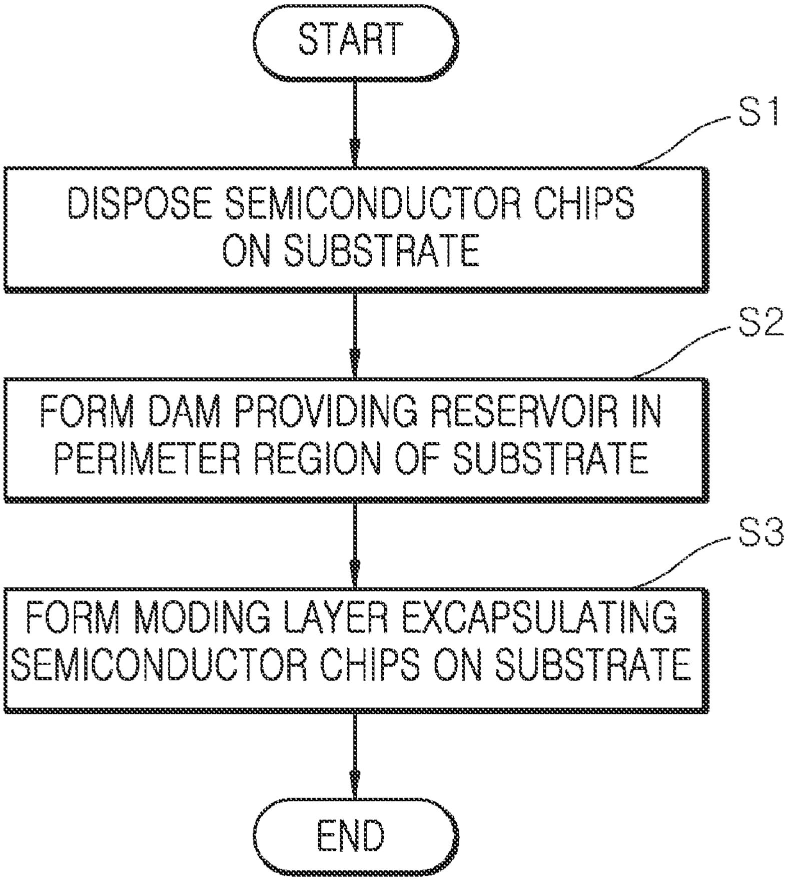
FIG. 1 is a flowchart illustrating a method of manufacturing a semiconductor package according to an embodiment of the present disclosure.

The terms used herein may correspond to words selected in consideration of their functions in presented embodiments, and the meanings of the terms may be construed to be different according to one of ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms "first" and "second,""side,""top" and "bottom, lower," etc. may be used herein to describe various devices, these devices should not be limited by these terms. These terms are only used to distinguish one device from another device, but not used to indicate a particular sequence or number of devices.

A semiconductor chip may include a semiconductor substrate or a semiconductor die. The semiconductor chip may include a structure in which a plurality of semiconductor substrates are stacked or a structure in which a plurality of semiconductor dies are stacked. The semiconductor substrate may refer to a semiconductor wafer in which electronic components and elements are integrated. Integrated circuits may be integrated in the semiconductor substrate. The integrated circuits may be integrated in the semiconductor die. The semiconductor substrate may be divided into a plurality of semiconductor dies.

The semiconductor chip may be a memory chip in which memory devices such as dynamic random-access memory (DRAM) devices, static random-access memory (SRAM) devices, NAND-type flash memory devices, NOR-type flash memory devices, magnetic random-access memory (MRAM) devices, resistive random-access memory (ReRAM) devices, ferroelectric random-access memory (FeRAM) devices, or phase change random-access memory (PcRAM) devices are integrated. The semiconductor chip may refer to a logic die or an ASIC chip in which logic circuits are integrated on a semiconductor substrate, or a processor such as an application processor (AP), a graphic processing unit (GPU), a central processing unit (CPU), or a system-on-chip (SoC).

The semiconductor chip may be an element constituting a semiconductor package or a semiconductor product. The semiconductor chip may be applied in information communication systems such as mobile phones, electronic systems associated with biotechnology or health care, or human wearable electronic devices. The semiconductor chip may be applicable to the internet of things (IoT).

Same reference numerals refer to same components throughout the specification. Even though a reference numeral might not be mentioned or described with reference to a drawing, the reference numeral may be mentioned or described with reference to another drawing. In addition, even though a reference numeral might not be shown in a drawing, it may be shown in another drawing.

FIG. 1 is a flowchart illustrating a method of manufacturing a semiconductor package according to an embodiment of the present disclosure.

Referring to FIG. 1, in the method of manufacturing a semiconductor package, semiconductor chips may be disposed on a substrate (S1), and a dam providing a reservoir may be formed in a perimeter region of the substrate (S2). The dam may be coupled to the substrate as a structure surrounding the semiconductor chips. A molding layer encapsulating the semiconductor chips may be formed over the substrate (S3). The dam may serve to block the flow of extrusion that may flow out from the molding layer while forming the molding layer. The extrusion may flow into the reservoir of the dam and be accommodated in the reservoir, thereby suppressing the outflow of the extrusion to the outside of the dam. Because the dam may block or suppress the extrusion, it is possible to suppress a mold flash defect caused by the extrusion flowing out of the substrate.

Figure 2:
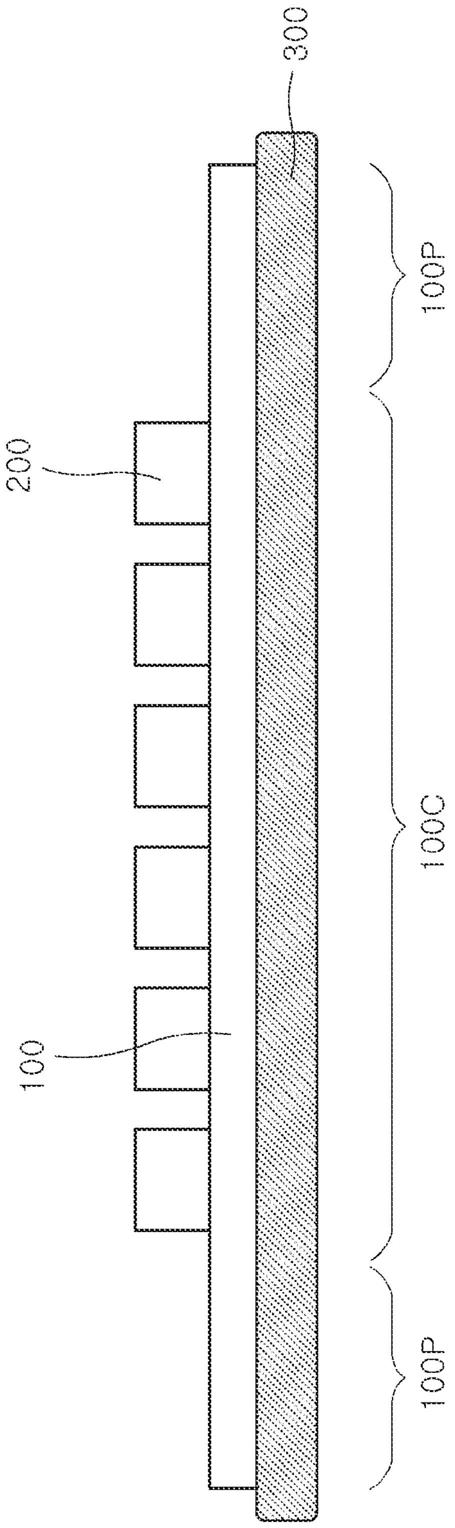
FIGS. 2 and 3 are a cross-sectional view and a plan view illustrating an arrangement of semiconductor chips on a substrate for a method of manufacturing the semiconductor package of FIG. 1.
Figure 3:
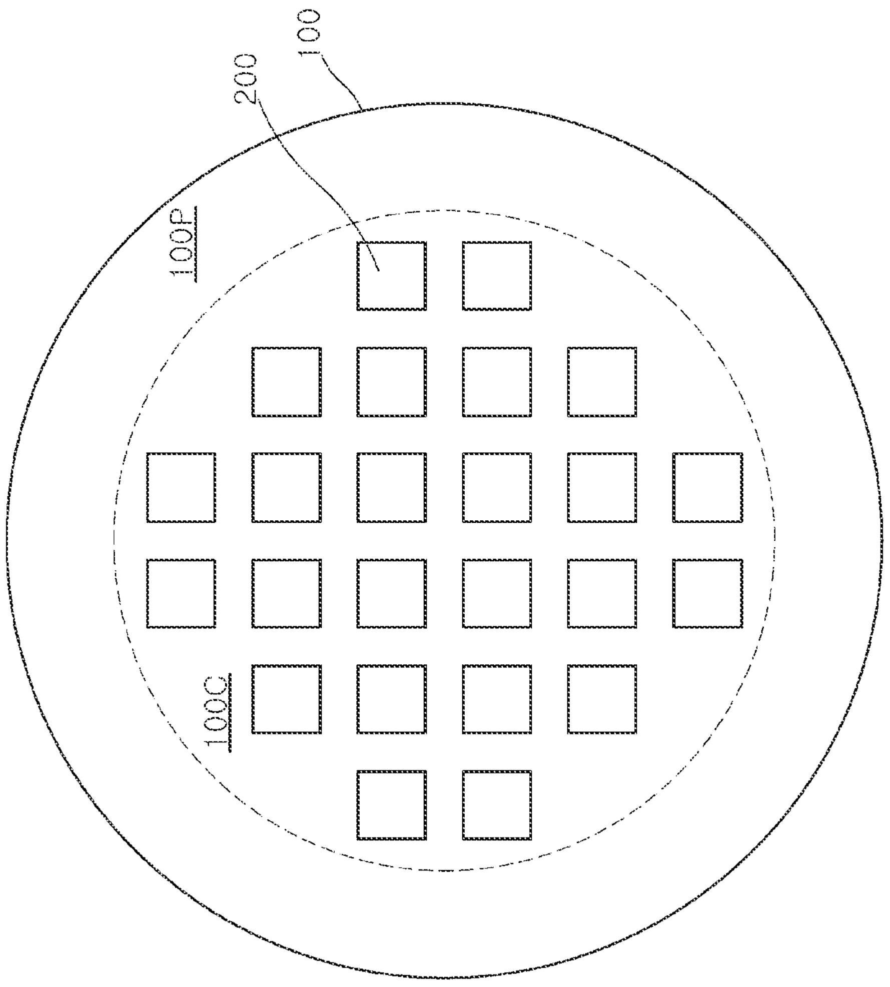

FIGS. 2 and 3 are a cross-sectional view and a plan view illustrating the step (S1) of disposing semiconductor chips on a substrate 100 in the method of manufacturing the semiconductor package of FIG. 1.

Referring to FIGS. 2 and 3, a plurality of semiconductor chips 200 may be disposed on the substrate 100. The plurality of semiconductor chips 200 may be mounted on the substrate 100 to be spaced apart from each other. A semiconductor chip 200 and a neighboring semiconductor chip 200 may be spaced apart from each other by a predetermined distance. The substrate 100 may include a chip region 100C and a perimeter region 100P. The chip region 100C may be a region where the semiconductor chips 200 are disposed and that substantially overlaps with the semiconductor chips 200. The perimeter region 100P may be a region extending along an edge of the substrate 100 while surrounding the chip region 100C. The perimeter region 100P may be a ring-shaped region surrounding the chip region 100C.

The substrate 100 may be a wafer-type substrate as depicted in FIG. 3. The substrate 100 may be a semiconductor substrate or a panel-type substrate. The substrate 100 may be a printed circuit board (PCB).

The substrate 100 may be loaded or attached on a carrier 300. In a state in which the substrate 100 is attached on the carrier 300, the semiconductor chips 200 may be disposed on the substrate 100. The carrier 300 may have a thickness greater than that of the substrate 100, or be made of a material that is more rigid than the substrate 100. The carrier 300 may include a glass material or a semiconductor material. The carrier 300 may be introduced as a member handling the substrate 100.

Figure 4:
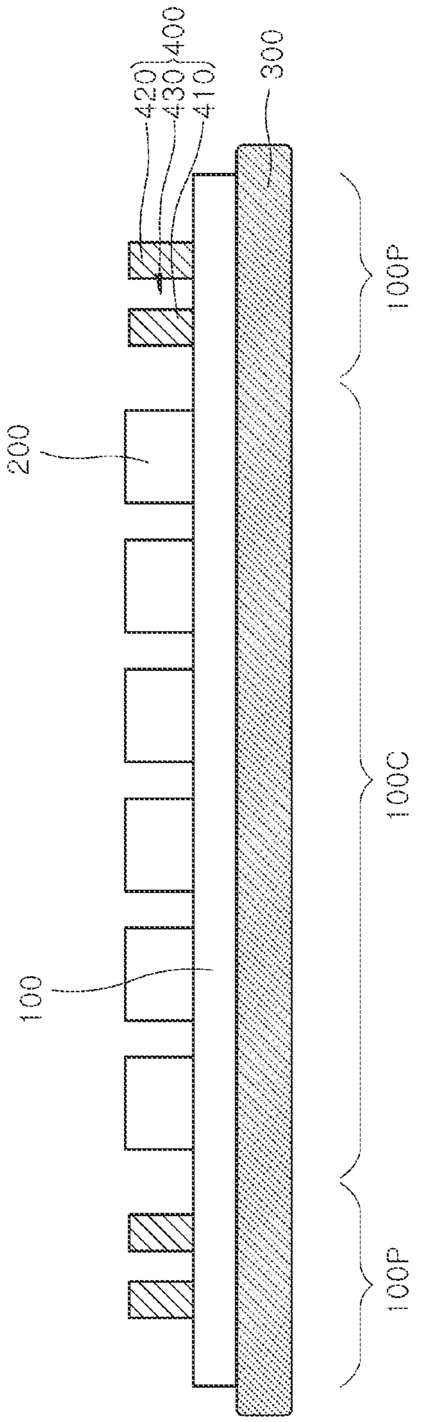
FIGS. 4 and 5 are a cross-sectional view and a plan view illustrating forming a dam on a substrate for a method of manufacturing the semiconductor package of FIG. 1.
Figure 5:
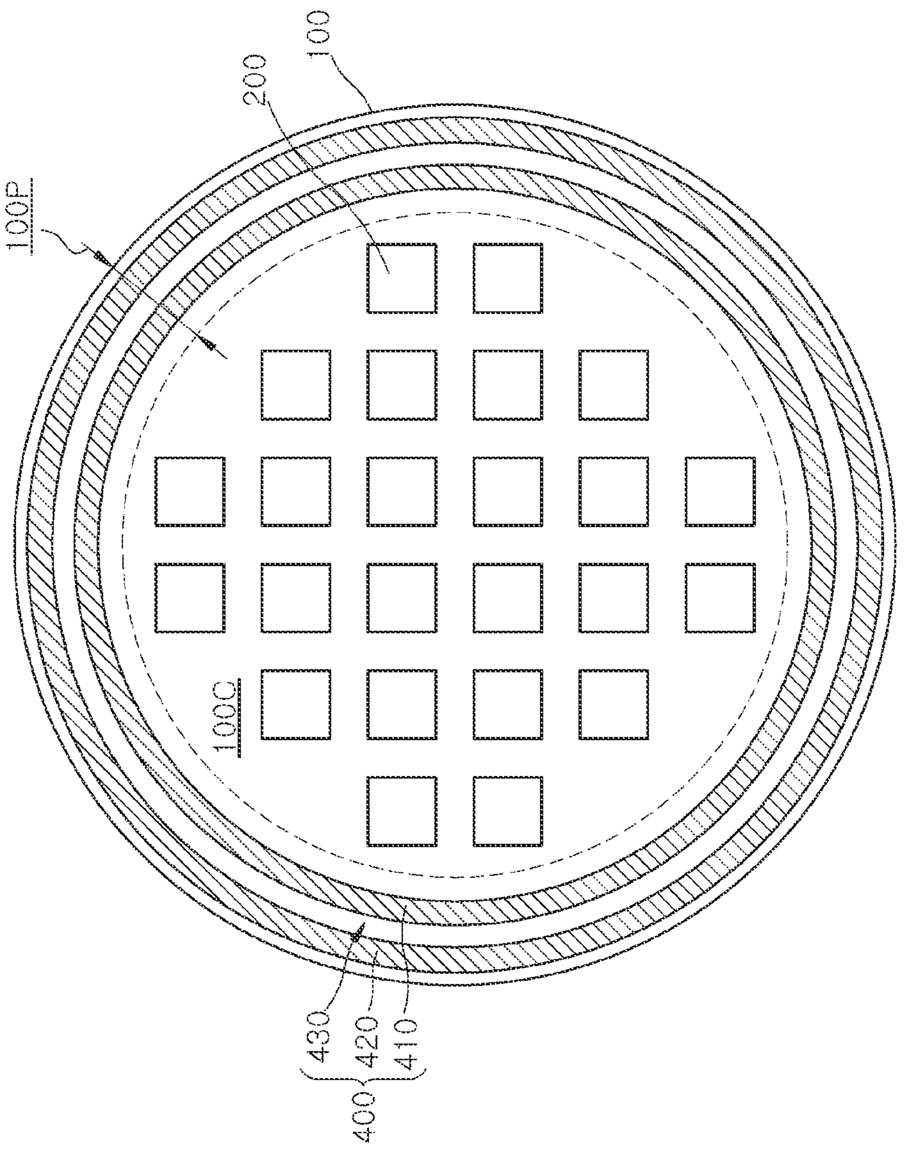

FIGS. 4 and 5 are a cross-sectional view and a plan view illustrating the step S2 of forming a dam 400 on the substrate 100 in the method of manufacturing the semiconductor package of FIG. 1.

Referring to FIGS. 4 and 5, the dam 400 may be formed on the substrate 100. The dam 400 may have a shape of a structure surrounding or encircling the semiconductor chips 200 disposed on the substrate 100. The dam 400 may be formed as a structure providing a reservoir 430. The reservoir 430 may have a shape of a concave groove. The dam 400 may be formed in the perimeter region 100P of the substrate 100.

An inner dam 410 and an outer dam 420 may be disposed side by side on the substrate 100 to form the dam 400. The inner dam 410 may be located closer to the semiconductor chips 200 than the outer dam 420. The inner dam 410 and the outer dam 420 may be spaced apart from each other. A space between the inner dam 410 and the outer dam 420 may be provided as the reservoir 430. The inner dam 410 and the outer dam 420 may have a ring shape extending along the perimeter region 100P of the substrate 100. The reservoir 430 may be provided in a ring shape or a trench shape extending along the perimeter region 100P of the substrate 100. Each of the inner dam 410 and the outer dam 420 may include resin, a photoresist material, or a dielectric material. Each of the inner dam 410 and the outer dam 420 may be made of an elastic body having elasticity.

In FIGS. 4 and 5, the dam 400 is depicted as a structure including the inner dam 410 and the outer dam 420, but the dam 400 may be formed in a structure including a plurality of inner dams 410 and/or a plurality of outer dams 420. The dam 400 may be formed as a structure in which a plurality of reservoirs 430 are disposed.

Figure 6:
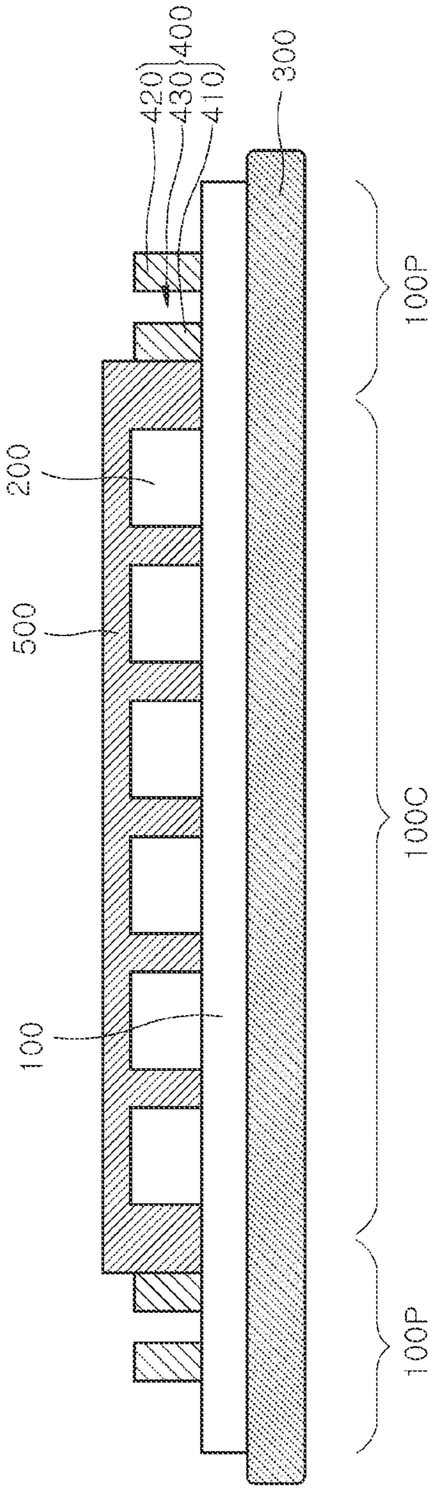
FIG. 6 is a cross-sectional view illustrating forming a molding layer on a substrate for a method of manufacturing the semiconductor package of FIG. 1.

FIG. 6 is a cross-sectional view illustrating the step (S3) of forming a molding layer 500 on the substrate 100 in the method of manufacturing the semiconductor package of FIG. 1.

Referring to FIG. 6, the molding layer 500 may be formed to cover and encapsulate the semiconductor chips 200 disposed on the substrate 100. The molding layer 500 may be formed through a molding process. While the molding layer 500 is being formed, a portion of the molding material constituting the molding layer 500 may flow out of the substrate 100. A molding pressure that presses the molding layer 500 may force the molding material to flow out of the substrate 100. The extrusion of the molding material may be blocked by the dam 400. Because the flow of the molding material to the outside of the substrate 100 may be blocked by the dam 400, mold flash failure caused by the extrusion from the molding layer 500 may be suppressed.

The extrusion from the molding layer 500 may be primarily blocked by the inner dam 410 of the dam 400. Even if the extrusion from the molding layer 500 further flows out of the inner dam 410 of the dam 400, the extrusion may be further blocked secondarily by the outer dam 420 while being accommodated in the reservoir 430.

Figure 7:
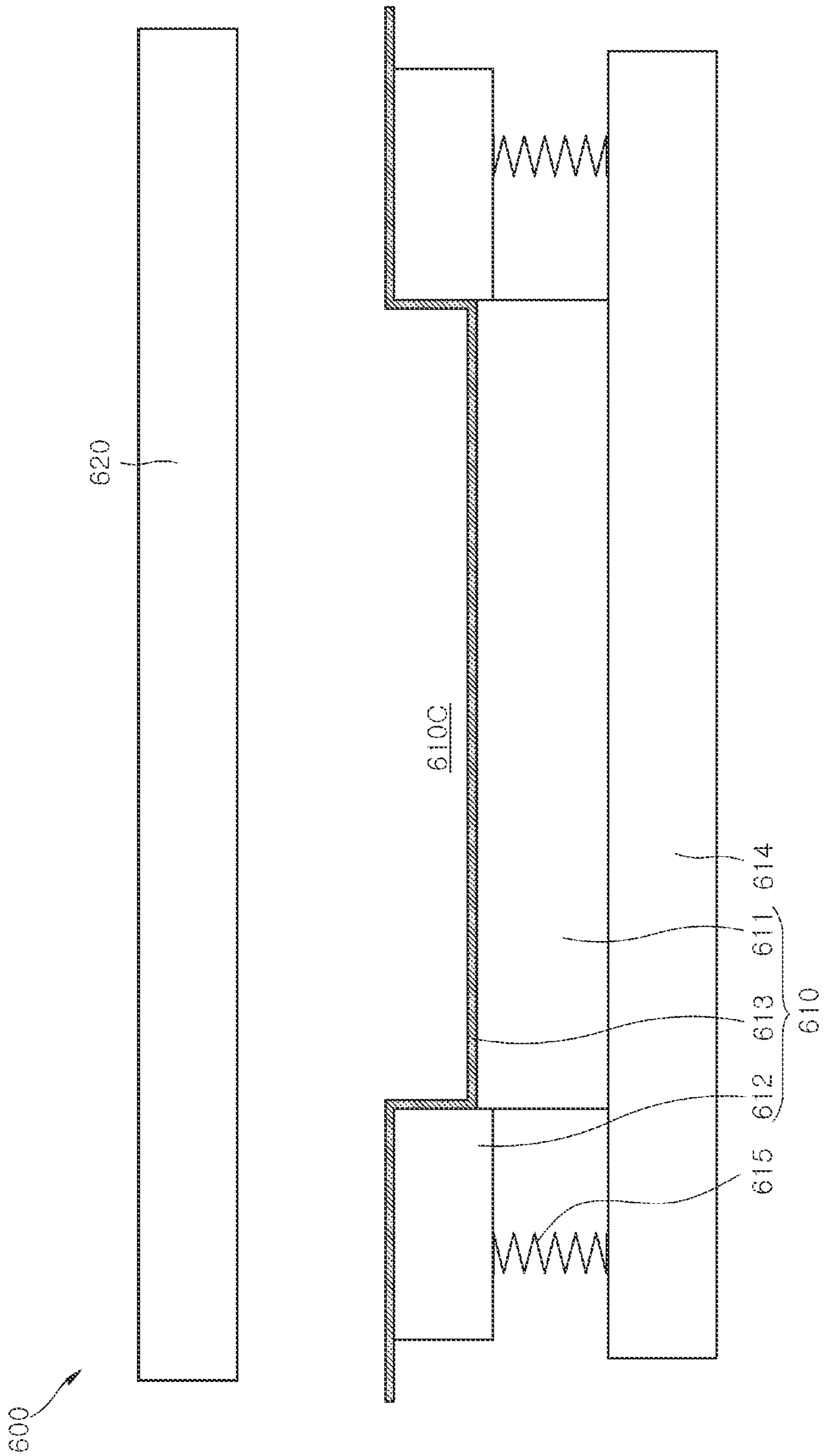
FIGS. 7 to 9 are cross-sectional views illustrating forming the molding layer of FIG. 6.
Figure 8:
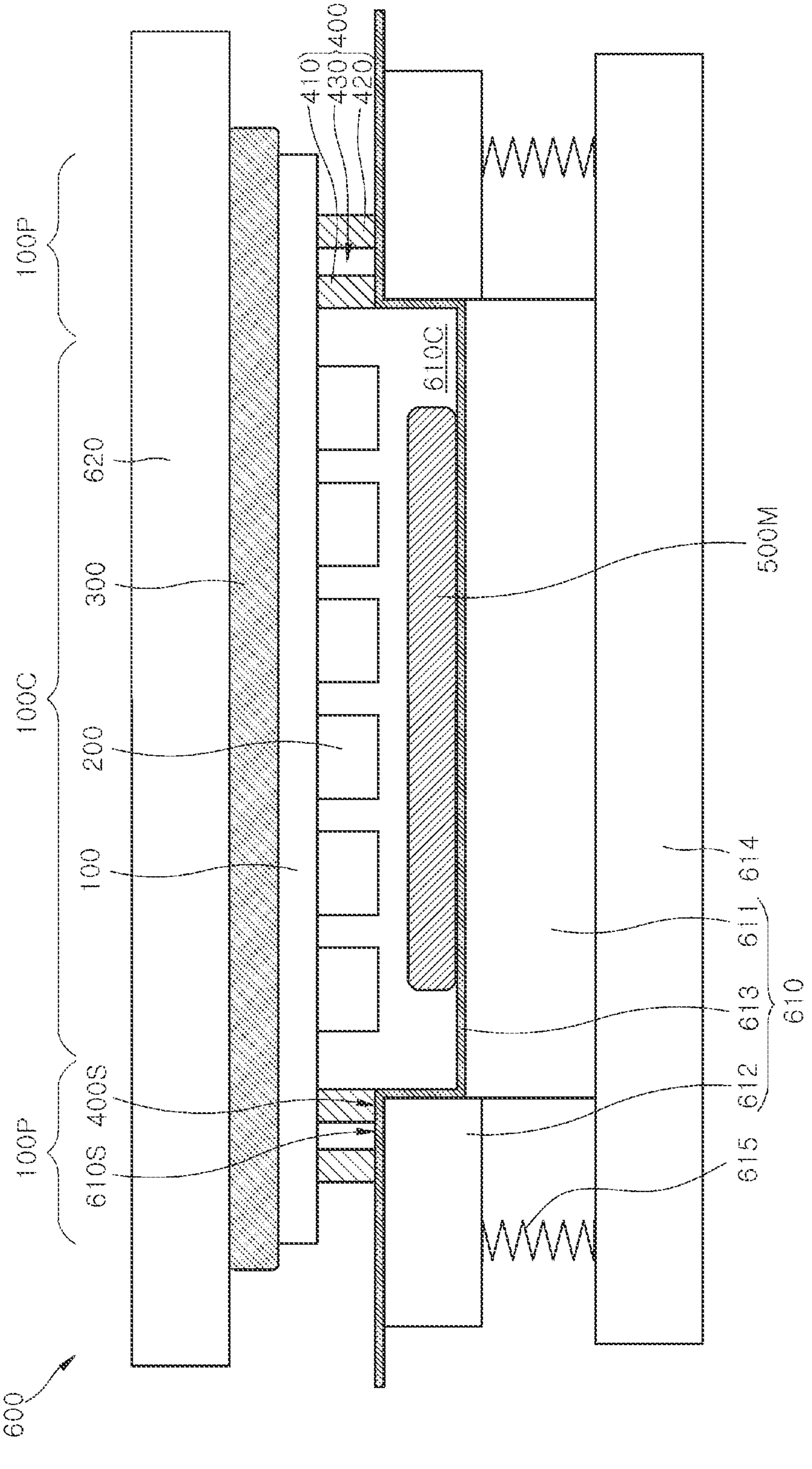
Figure 9:
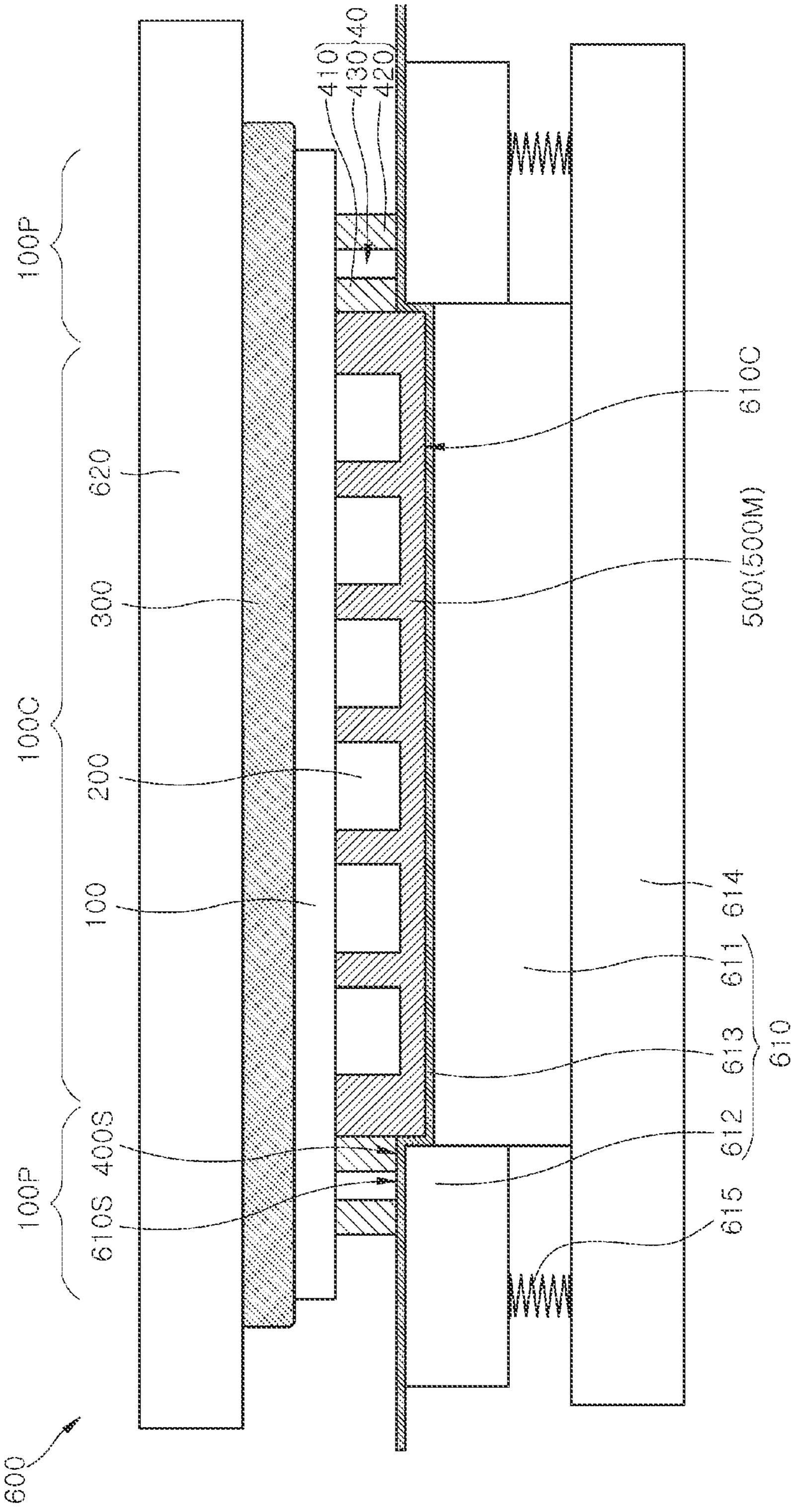

FIGS. 7 to 9 are cross-sectional views illustrating forming the molding layer 500 of FIG. 6. FIG. 7 is a view illustrating a molding apparatus 600 for forming the molding layer 500 of FIG. 6.

Referring to FIGS. 7 and 6, the molding layer 500 may be formed through a molding process using the molding apparatus 600. The molding apparatus 600 may include a molding cavity 610C for imparting a shape to the molding layer 500. A lower mold chase 610 may be configured to provide the molding cavity 610C. The molding apparatus 600 may include the lower mold chase 610 and an upper mold chase 620. The substrate 100 may be loaded between the upper mold chase 620 and the lower mold chase 610.

The lower mold chase 610 may include a bottom mold chase 611 and a side mold chase 612. The bottom mold chase 611 and the side mold chase 612 may be combined to provide the molding cavity 610C in a concave shape. The side mold chase 612 may have a cylinder shape. The side mold chase 612 may have a shape having an empty space in the center. The bottom mold chase 611 and the side mold chase 612 may be assembled so that the bottom mold chase 611 may be inserted into the side mold chase 612 to be raised and lowered. The bottom mold chase 611 may be raised or lowered along an inner sidewall of the side mold chase 612.

The lower mold chase 610 may further include a release film 613 extending to cover the bottom and sidewall of the molding cavity 610. The release film 613 may extend to cover a portion of a surface of the bottom mold chase 611 and a portion of a surface of the side mold chase 612. The release film 613 may be a film that contacts the molding layer 500 when the molding layer 500 is molded. The release film 613 may be an element that assists in releasing the molding layer 500 from the lower mold chase 610 after molding the molding layer 500. The release film 613 may be an element that assists in forming a vacuum in the molding cavity 610C during the molding process.

The molding apparatus 600 may further include a bottom press 614 that raises or lowers the bottom mold chase 611. The bottom press 614 may be an element that is fastened to the bottom mold chase 611 and supports the bottom mold chase 611. The side mold chase 612 may be connected to the bottom press 614 through an elastic part 615. The side mold chase 612 may be supported by the bottom press 614 through the elastic part 615. The elastic part 615 may include an elastic member such as a spring.

FIG. 8 is a view illustrating that the substrate 100 is loaded over the molding apparatus 600 of FIG. 7.

Referring to FIG. 8, to form the molding layer (500 of FIG. 6), a molding material 500M, which is a material for forming the molding layer 500, may be provided in the molding cavity 610C provided by the lower mold chase 610. The molding material 500M may include an encapsulant material such as an epoxy molding compound (EMC). The molding material 500M may be dispensed on the bottom of the molding cavity 610C. Although FIG. 8 depicts the molding material 500M being dispensed on the bottom of molding cavity 610C, providing the molding material 500M into the molding cavity 610C is not limited thereto.

The substrate 100 may be loaded over the lower mold chase 610. The substrate 100 of FIG. 4 may be reversed and loaded over the lower mold chase 610 so that the semiconductor chips 200 face the molding cavity 610C. The upper mold chase 620 may hold the substrate 100 and load the substrate 100 over the lower mold chase 610. Because the carrier 300 may be interposed between the substrate 100 and the upper mold chase 620, the upper mold chase 620 may substantially hold the carrier 300 to load the substrate 100 over the lower mold chase 610. The bottom mold chase 611 of the lower mold chase 610 may be located at a position overlapping with the semiconductor chips 200, and the side mold chase 612 may be located at a position overlapping with the dam 400.

The substrate 100 may be loaded over the lower mold chase 610 so that the surfaces 400S of the protruding ends of the dam 400 of the substrate 100 contact some parts of the surface of the lower mold chase portion 610. The substrate 100 may be loaded over the lower mold chase 610 so that the lower mold chase 610 may close and shut the reservoir 430 of the dam 400. The upper mold chase 620 may be lowered toward the lower mold chase 610 so as to press the substrate 100 against the lower mold chase 610 using the upper mold chase 620. As the upper mold chase 620 is lowered, pressure may be applied to the dam 400 of the substrate 100 so that the surfaces 400S of the protruding ends of the dam 400 of the substrate 100 come into close contact with some portions of the surface of the lower mold chase 610. Accordingly, the inner space surrounded by the dam 400 of the substrate 100 and the molding cavity 610C may be substantially closed.

FIG. 9 is a view illustrating that the molding layer 500 is formed on the substrate 100 using the molding apparatus of FIG. 7.

Referring to FIGS. 8 and 9, the molding material 500M may be flowed to cover the semiconductor chips 200. Heat may be applied to the molding material 500M through the lower mold chase 610, and the molding material 500M may be flowed in the molding cavity 610C. Pressure may be applied to the molding material 500M so as to be molded into the molding layer 600. The bottom mold chase 611 of the lower mold chase 610 may be raised toward the upper mold chase 620, so that molding pressure may be applied to the molding material 500M in the molding cavity 610C. In this way, the molding material 500M may be molded to form the molding layer 500.

The molding pressure for molding the molding layer 500 may force the molding material 500M to flow out of the substrate 100. The flow of the molding material 500M may be blocked by the dam 400. Accordingly, mold flash defects may be suppressed.

Figure 10:
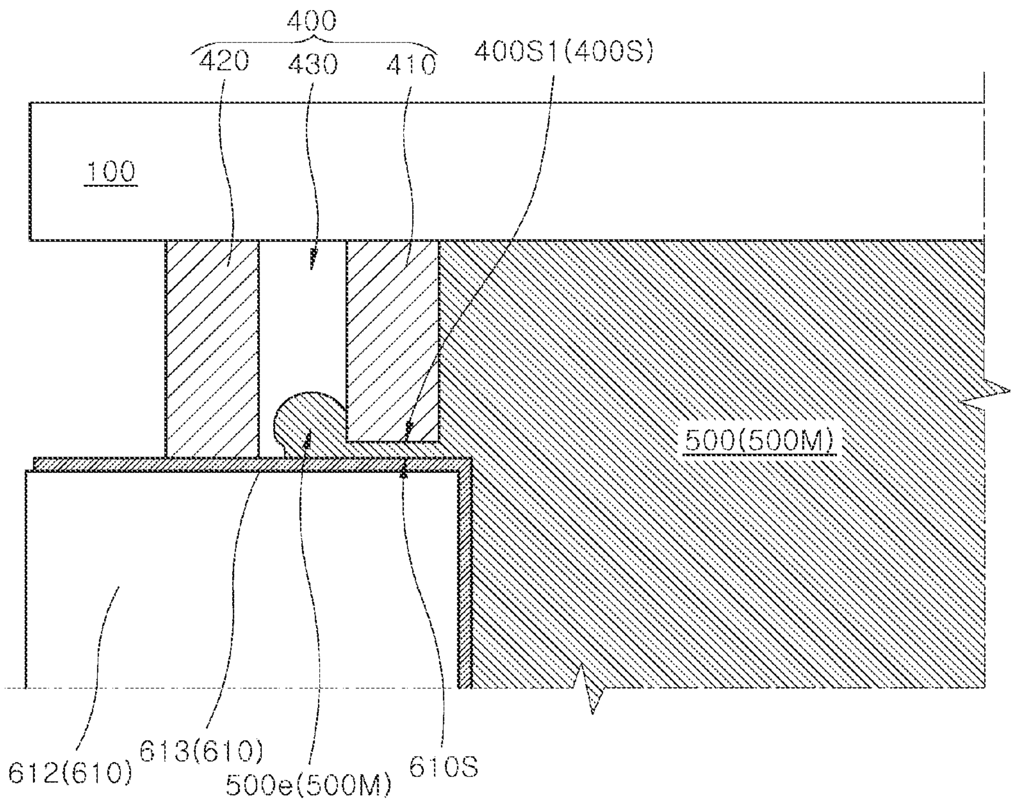
FIG. 10 is a cross-sectional view illustrating blocking a molding material by a dam of FIG. 6.

FIG. 10 is a cross-sectional view illustrating that the dam 400 of FIG. 9 blocks the molding material 500M.

Referring to FIGS. 9 and 10, the molding pressure for molding the molding layer 500 may be transferred to the dam 400 through the molding material 500M. Some portions of the dam 400 may be deformed by the molding pressure transferred to the dam 400. As some portions of the dam 400 are deformed, some portions of the surfaces 400S of the ends of the dam 400 may be separated from the surface 610S of the lower mold chase 610. Because the inner dam 410 of the dam 400 is more directly affected by the molding pressure than the outer dam 410, the inner dam 410 of the dam 400 may be deformed earlier than the outer dam 410. The end surface 400S1 of the inner dam 410 of the dam 400 may be spaced apart from the portions of the surface 610S of the lower mold chase 610.

The molding material 500M may be flow out through a gap between the end surface 400S1 of the inner dam 410 and the portions of the surface 610S of the lower mold chase 610. The extrusion of the molding material 500M may flow into the reservoir 430 of the dam 400 and be contained in the reservoir 430. Because the extrusion 500E may be contained in the reservoir 430, the reservoir 430 may serve to delay the extrusion 500E of the molding material 500M from reaching the outer dam 420. In this manner, the dam 400 may provide the reservoir 430, so that the outflow of the extrusion 500E to the outside of the dam 400 may be suppressed. The dam 400 may suppress the outflow of the extrusion 500E to the outside of the substrate 100. Accordingly, it is possible to suppress mold flash defects that may accompany the formation of the molding layer 500.

Figure 11:
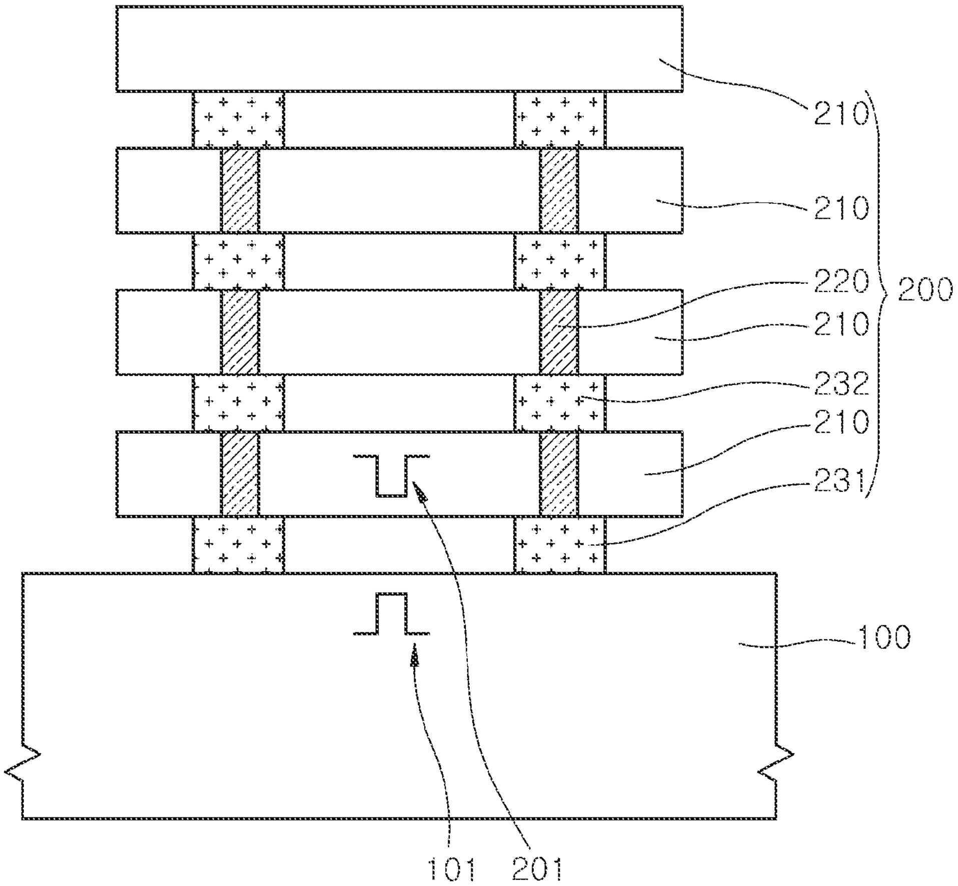
FIG. 11 is a cross-sectional view illustrating an example of the semiconductor chip of FIG. 2.

FIG. 11 is a cross-sectional view illustrating an example of the semiconductor chip 200 of FIG. 2.

Referring to FIG. 11, the semiconductor chip 200 may include a plurality of stacked semiconductor dies 210. The semiconductor dies 210 may be stacked vertically over the substrate 100. Each of the semiconductor dies 210 may include first integrated circuits 201. The substrate 100 may include second integrated circuits 101. The first integrated circuits 201 may constitute memory devices. The second integrated circuits 101 may constitute control devices for controlling the operations of the first integrated circuits 201. The substrate 100 and the semiconductor dies 210 may constitute a high bandwidth memory (HBM) device.

Some or all of the semiconductor dies 210 may include through vias 220 as electrical connection elements. Each of the through vias 220 may be formed in the shape of a through silicon via (TSV). The semiconductor chip 200 may include first connectors 231 connecting at least one semiconductor die 210 to the substrate 100. Each of the first connectors 231 may be formed in the shape of a conductive bump. The semiconductor chip 200 may include second connectors 232 that are located between the semiconductor dies 210 and connect the semiconductor dies 210 to each other. Each of the second connectors 232 may be formed in the shape of a conductive bump.

Figure 12:
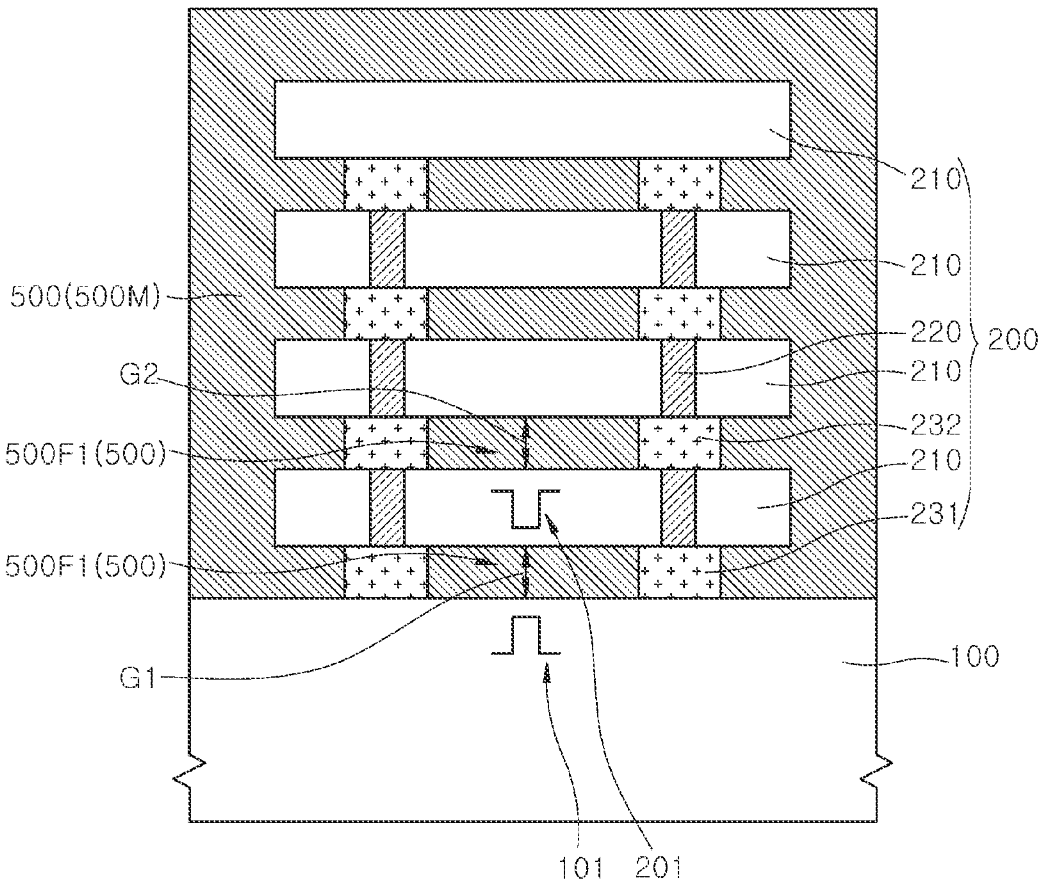
FIG. 12 is a cross-sectional view illustrating an example of a molding layer that encapsulates the semiconductor chip of FIG. 11.

FIG. 12 is a cross-sectional view illustrating an example of the molding layer 500 that encapsulates the semiconductor chip 200 of FIG. 11.

Referring to FIG. 12, the molding layer 500 may extend to fill the spaces between the semiconductor die 210 and the substrate 100 and to separate the first connectors 231 from each other. As the first connectors 231 are interposed between the semiconductor die 210 and the substrate 100, a gap G1 or a separation space may be generated between the semiconductor die 210 and the substrate 100. While the molding layer 500 is molded as described above with reference to FIG. 9, the molding material 500M constituting the molding layer 500 may be introduced to fill the gap G1 between the semiconductor die 210 and the substrate 100. Accordingly, a portion 500F1 of the molding layer 500 may fill the gap G1 between the semiconductor die 210 and the substrate 100. The portion 500F1 of the molding layer 500 may be formed to electrically separate the first connectors 231 from each other.

The molding layer 500 may extend to fill the spaces between the semiconductor dies 210 and to separate the second connectors 232 from each other. As the second connectors 232 are interposed between the semiconductor dies 210, gaps G2 or separation spaces may be formed between the semiconductor dies 210. While the molding layer 500 is molded, the molding material 500M constituting the molding layer 500 may be introduced to fill the gaps G2 between the semiconductor dies 210. Accordingly, other portions 500F2 of the molding layer 500 may fill the gaps G2 between the semiconductor dies 210. Other portions 500F2 of the molding layer 500 may be formed to electrically separate the second connectors 232 from each other.

The present teachings have been disclosed in conjunction with some embodiments as described above. Those skilled in the art will appreciate that various modifications, additions, and/or substitutions are possible, without departing from the scope and spirit of the present teachings. Accordingly, the embodiments disclosed in the present specification should be considered from not a restrictive standpoint but an illustrative standpoint. The scope of the present teachings is not limited to the above descriptions but defined by the accompanying claims, and all the distinctive features in the equivalent scope should be construed as being included in the present teachings.

What is claimed is:

1. A method of manufacturing a semiconductor package, the method comprising:

disposing semiconductor chips over a substrate;

forming a dam surrounding the semiconductor chips, the dam providing a reservoir in a perimeter region of the substrate; and forming a molding layer encapsulating the semiconductor chips on the substrate;

wherein extrusion flowing out from the molding layer is contained in the reservoir while blocked by the dam;

wherein forming the molding layer includes:

introducing a molding material in a molding cavity of a lower mold chase;

loading the substrate over the lower mold chase such that the semiconductor chips face the molding cavity of the lower mold chase and an end surface of the dam at least partially contacts a surface of the lower mold chase; and flowing the molding material to cover the semiconductor chips.

2. The method of claim 1, wherein the reservoir of the dam has a shape of a concave groove.

3. The method of claim 1, wherein the dam includes:

an inner dam; and an outer dam located apart from the inner dam, wherein the reservoir is provided as a space between the inner dam and the outer dam.

4. The method of claim 3, wherein each of the inner dam and the outer dam has a shape of a ring extending along a perimeter region of the substrate.

5. The method of claim 3, wherein each of the inner dam and the outer dam includes resin, a photoresist material, or a dielectric material.

6. The method of claim 1, wherein loading the substrate over the lower mold chase includes the lower mold chase closing the reservoir of the dam.

7. The method of claim 1, wherein the lower mold chase includes:

a bottom mold chase located at a position overlapping with the semiconductor chips;

a side mold chase located at a position overlapping with the dam and providing the molding cavity together with the bottom mold chase; and a release film extending to at least partially cover a surface of the bottom mold chase and a surface of the side wall mold chase.

8. The method of claim 7, wherein loading the substrate over the lower mold chase includes pressing the substrate against the lower mold chase using the upper mold chase.

9. The method of claim 1, wherein the substrate comprises a semiconductor substrate, a wafer-type substrate, a panel-type substrate, or a printed circuit board (PCB).

10. The method of claim 1, wherein the semiconductor chips include:

at least one semiconductor die; and first connectors connecting the semiconductor die to the substrate; and wherein the molding layer fills a space between the at least one semiconductor die and the substrate and extends to separate the first connectors from each other.

11. The method of claim 1, wherein the semiconductor chips include:

stacked semiconductor dies; and second connectors located between the semiconductor dies and connecting the semiconductor dies to each other; and wherein the molding layer fills a space between the semiconductor dies and extends to separate the second connectors from each other.

12. The method of claim 1, wherein the semiconductor chip includes a plurality of stacked semiconductor dies.

13. The method of claim 1, wherein the molding layer includes epoxy mold compound (EMC).

* * * * *